US011486901B2

(12) United States Patent
Cheng et al.

(10) Patent No.: US 11,486,901 B2
(45) Date of Patent: Nov. 1, 2022

(54) SYSTEM FOR DATA MAPPING AND STORING IN DIGITAL THREE-DIMENSIONAL OSCILLOSCOPE

(71) Applicant: UNIVERSITY OF ELECTRONIC SCIENCE AND TECHNOLOGY OF CHINA, Sichuan (CN)

(72) Inventors: Yuhua Cheng, Chengdu (CN); Bo Xu, Chengdu (CN); Kai Chen, Chengdu (CN); Songting Zou, Chengdu (CN); Libing Bai, Chengdu (CN); Hang Geng, Chengdu (CN); Yanjun Yan, Chengdu (CN); Jia Zhao, Chengdu (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 15 days.

(21) Appl. No.: 17/220,160

(22) Filed: Apr. 1, 2021

(65) Prior Publication Data
US 2021/0215744 A1 Jul. 15, 2021

(30) Foreign Application Priority Data
Aug. 12, 2020 (CN) .......................... 202010805640.5

(51) Int. Cl.
*G01R 13/02* (2006.01)
(52) U.S. Cl.
CPC ....... *G01R 13/029* (2013.01); *G01R 13/0218* (2013.01)
(58) Field of Classification Search
CPC .......................... G01R 13/029; G01R 13/0218
See application file for complete search history.

(56) References Cited

U.S. PATENT DOCUMENTS

| 10,119,997 | B2* | 11/2018 | Zhang | G01R 13/0254 |
|---|---|---|---|---|
| 10,677,817 | B2* | 6/2020 | Yang | G01R 13/029 |
| 10,885,604 | B2* | 1/2021 | Huang | G06T 1/60 |
| 2009/0309879 | A1* | 12/2009 | Gorbics | G01R 13/0227 345/440.1 |
| 2018/0149676 | A1* | 5/2018 | Yang | G01R 13/02 |

OTHER PUBLICATIONS

Yang, Kuojun, et al. "A seamless acquisition digital storage oscilloscope with three-dimensional waveform display" Review of Scientific Instruments 85.4 (2014): 045102 (Year: 2014).*

* cited by examiner

*Primary Examiner* — Toan M Le
*Assistant Examiner* — Xiuqin Sun
(74) *Attorney, Agent, or Firm* — Oliff PLC

(57) ABSTRACT

A system maps and stores data in digital three-dimensional oscilloscope, wherein an ADC module has four ADC submodules. Four acquired waveform data are sent to an extraction module, and buffered in a FIFO module. When a trigger signal arrives, FIFO module outputs four extracted waveform data to a mapping address calculation module for calculating a mapping address and a RAM serial number for each point data, and the waveform data comparison and control module performs the reading and writing control of the 4×N dual port RAMs. When mapping number reaches a frame number, the RAM array module outputs its waveform probability values to the upper computer module to convert each value into RBG values, and the display module displays the waveforms of input signals of four channels on a screen according the RBG values.

2 Claims, 4 Drawing Sheets

SYSTEM FOR DATA MAPPING AND STORING IN DIGITAL THREE-DIMENSIONAL OSCILLOSCOPE

FIELD OF THE INVENTION

This application claims priority under the Paris Convention to Chinese Patent Application No. 202010805640.5, filed on Aug. 12, 2020, the entirety of which is hereby incorporated by reference for all purposes as if fully set forth herein.

The present invention relates to the field of digital three-dimensional oscilloscope (DTO), more particularly to a system for data mapping and storing in digital three-dimensional oscilloscope.

BACKGROUND OF THE INVENTION

With the continuous development of technology, in time-domain measurement, the requirements to the display of oscilloscope are growing higher. For traditional oscilloscope, only one frame of waveform which is satisfied with trigger can be moved to the screen of the oscilloscope, which makes the user difficult to directly observe the frequency of occurrence of abnormal signals. To solve the problem of the observation of abnormal signal through improving the waveform capture rate (WCR), digital the dimensional oscilloscope (DTO) has been developed and become the mainstream of the market. In DTO, the acquired data is mapped, and then stored into the waveform database; after a plurality of acquisitions and mappings, the waveform information accumulated in the database will be sent to screen at one time. In addition, DTO will visually show probability information which is contained in the accumulated waveform information (waveform probability values) by color or luminance through image process, which makes the user observe the abnormal signal of interest better.

When a DTO needs to send the waveform data of multiple channels to display simultaneously on screen, each channel's data which are acquired and mapped for a plurality of times needs to be written into a waveform database. A structure of data mapping and storing has been proposed by some instrument manufacturers. In the structure, DTO rapidly acquires and maps each channel's data, and then stores the processed data into the waveform database corresponding to each channel, and lastly, sends respectively the accumulated waveform information (waveform probability values) in each waveform database to screen to display at one time. However, the structure of data mapping and storing has the deficiencies such as high consumption of storage resources and complex control logic.

An improved structure of data mapping and storing in the prior art is proposed, which is detailed as follows:

When a DTO needs to send the waveform data of multiple channels to display simultaneously on screen, the multiple channels' waveform data acquired by corresponding ADCs are buffered in corresponding FIFOs when a frame of waveform data are buffered, each FIFO's output data are converted into the addresses of a plurality of dual port RAMs through calculation of mapping address, and the DTO updates the waveform probability values of corresponding addresses of the dual port RAM by step mode. A plurality of dual port RAMs correspond to one channel's data. When adequate frames of the waveform probability values of the multiple pluralities of dual port RAMs are updated, the waveform probability values of multiple channels are superimposed according to the pixel position of the screen, and then sent to screen, thus displaying waveform data of multiple channels simultaneously on screen is realized. The improved structure has simple logic, and is easy to implement. However, the waveform probability values outputted by the multiple pluralities of dual port RAMs need to be superimposed pixel by pixel according to the pixel position of the screen, the superposition calculations will consume a lot of time, which leads to a lower waveform capture rate (WCR). On the other hand, a plurality of dual port RAMs is responsible for the storage of one channel's waveform probability values, which leads to an insufficient use of the RAM resource. Furthermore, when the channels or the screen resolutions of a DTO increase, the more RAM resource will be consumed.

SUMMARY OF THE INVENTION

The present invention aims to overcome the deficiencies of the prior art, and provides a system for data mapping and storing in digital three-dimensional oscilloscope to save storage resource and to shorten the dead time caused by waveform data acquisition and process to improve the waveform capture rate (WCR) of DTO by improving the speed of storing and outputting waveform probability values, through improving the storage structure and the storage logic of waveform data.

To achieve these objectives, in accordance with the present invention, a system for data mapping and storing in digital three-dimensional oscilloscope is provided, comprising:

an upper computer module;

an ADC module, which comprises four ADC submodules respectively corresponding to four channels, wherein the four ADC submodules respectively acquire the input signals of the four channels and output four waveform data ADC_DATA_1, ADC_DATA_2, ADC_DATA_3, ADC_DATA_4, the resolutions of the four ADC submodules all are M bits, the number of the data points outputted by an ADC submodule in one synchronization period of the data output synchronization clock is N;

an extraction module, wherein the extraction module receive the four waveform data ADC_DATA_1, ADC_DATA_2, ADC_DATA_3, ADC_DATA_4 and respectively extract data from them according to a divisor set by the upper computer module, and four extracted waveform data DATA_IN_1, DATA_IN_2, DATA_IN_3, DATA_IN_4 are obtained and denoted by extracted waveform data DATA_IN_i, i=1,2,3,4, i is the serial number of channel; if the divisor is less than N, the extraction mode is denoted by extraction mode A, N points of data of an extracted waveform data DATA_IN_i are combined into one data of an extracted waveform data EXTRACT_DATA_i, the four extracted waveform data DATA_IN_i, i=1,2,3,4, are combined synchronously, and after a combination is complete, the extraction module generates a valid data flag, the continuous valid data flags constitute a valid data flag signal EXTRACT_VALID; if the divisor is equal to N, the extraction mode is denoted by extraction mode B, one point of data of an extracted waveform data DATA_IN_i is taken as one data of an extracted waveform data EXTRACT DATA_i, the four extracted waveform data DATA_IN_i, i=1,2,3,4, are taken synchronously, and after a taking is complete, the extraction module generates a valid data flag, the continuous valid data flags constitute a valid data flag signal EXTRACT_VALID;

a trigger module, wherein the extraction module sends the four extracted waveform data EXTRACT_DATA_i, i=1,2, 3,4, and the valid data flag signal EXTRACT_VALID to the trigger module, and the trigger module generates a trigger signal TRIG_OUT according to a plurality of trigger parameters and a trigger channel set by the upper computer module;

a FIFO module, wherein the extraction module delays, and then sends the four extracted waveform data EXTRACT_DATA_i, i=1,2,3,4, and the valid data flag signal EXTRACT_VALID to the FIFO module the trigger module sends the trigger signal TRIG_OUT to the FIFO module; the FIFO module comprises four FIFO submodules DTO_FIFO_i, i=1,2,3,4, respectively corresponding to four extracted waveform data EXTRACT_DATA_i, i=1,2,3,4, the FIFO module buffers the four extracted waveform data EXTRACT_DATA_i, i=1,2,3,4, according to the valid data flag signal EXTRACT_VALID and the trigger signal TRIG_OUT: when the valid data flag signal EXTRACT_VALID is turned into high level (a valid data flag appears), the four FIFO modules enter write mode, the four extracted waveform data EXTRACT_DATA_i, i=1,2,3,4, are respectively written into corresponding FIFO submodules DTO_FIFO_i, i=1,2,3,4, when the amount of the data written into the four FIFO submodules reaches a pre-trigger depth which is set by the upper computer module, the four FIFO modules enter read-while-write mode; when a trigger signal TRIG_OUT arrives, the four FIFO submodules continuously output their extracted waveform data, which are denoted by FIFO output data $X_i$, i=1,2,3,4, until a frame of extracted waveform data are completely outputted, at the same time, the FIFO module generates a valid output data flag upon one extracted waveform data output, the continuous valid output data flags constitute a valid output data flag signal FIFO_VALID;

a mapping address calculation module, wherein the mapping address calculation module receives FIFO output data $X_i$, i=1,2,3,4, and valid output data flag signal FIFO_VALID, and then calculates a mapping address and a RAM serial number for each point data of FIFO output data $X_i$, i=1,2,3,4, in parallel:

1): setting valid output data flag number k to 1;
2): monitoring the valid output data flag signal FIFO_VALID, when the valid output data flag signal FIFO_VALID is turned into high level (a valid output data flag appears), which means FIFO output data $X_i$, i=1,2,3,4, are valid, then going to step 3);
3): initializing data serial number n to 1;
4): calculating serial number $j_{in}^k$ of $n^{th}$ point data $X_{in}^k$ of $k^{th}$ data $X_i^k$ of FIFO output data $X_i$ in a screen of data points: $j_{in}^k=(k-1)N'+n$, where N'=N, if the extraction mode is extraction mode A, N'=1, if the extraction mode is extraction mode B;
5): calculating address (location) $A_{in}^k$ in 3D waveform database according to point data $X_{in}^k$;
6): calculating mapping address $\tilde{A}_{in}^k$ and RAM serial number $J_{in}^k$ for point data $X_{in}^k$: $\tilde{A}_{in}^k=A_{in}^k+(f-1)H$, $J_{in}^k=j_{in}^k-(f-1)\times(4\times N)$, where f is the cycle number at the time of current calculation, where H is the number of vertical points of the screen of DTO;
7): judging whether n<N', if yes, then letting n=n+1 and returning to step 4), otherwise, going to step 8);
8): judging whether k<K, if yes, then letting k=k+1 and returning to step 2), otherwise, going to step 1), where K=L/N under the circumstance that the extraction mode is extraction mode A, or K=L under the circumstance that the extraction mode is extraction mode B, L is the number of horizontal points of the screen of DTO;

a RAM array module, wherein the RAM array module comprises 4×N dual port RAMs, the address depth of each dual port RAM is L×H/(4×N), the bit-width of the storage unit corresponding to an address of dual port RAM is 2+M, where the 2 high bits are used for storing the channel ID, the M low bits are used for storing waveform probability value;

a waveform data comparison and control module, wherein the waveform data comparison and control module comprises 4×N waveform data comparison modules, which respectively correspond to the 4×N dual port RAMs, the waveform data comparison and control module performs the parallel reading and writing control of the 4×N dual port RAMs as follows:

1): initializing waveform frame number c to 1;
2): initializing circle number f to 1;
3): comparing and processing the waveform probability values in 4×N dual port RAMs: after each four pairs of mapping address $\tilde{A}_{in}^k$ and RAM serial number $J_{in}^k$, i=1,2,3,4, are calculated, the mapping address calculation module reduces the rate of the four pairs of mapping address $\tilde{A}_{in}^k$ and RAM serial number $J_{in}^k$, i=1,2,3,4, by 4 times, and send the four pairs of mapping address $\tilde{A}_{in}^k$ and RAM serial number $J_{in}^k$, i=1,2,3,4, to the RAM array module and the waveform data comparison and control module in parallel; for each channel, the waveform data comparison and control module determines a channel ID (determined channel ID) by the channel corresponding to point data $X_{in}^k$, then sends the determined channel ID to waveform data comparison module $J_{in}^k$; at the same time, the waveform data comparison and control module reads out a channel ID (readout channel ID) and a waveform probability value (readout waveform probability value) from a storage unit of dual port RAM $J_{in}^k$ according to mapping address $\tilde{A}_{in}^k$, and then sends the readout channel ID and the readout waveform probability value to waveform data comparison module $J_{in}^k$; waveform data comparison module $J_{in}^k$ processes the readout channel IDs and the readout waveform probability values according to the following three conditions:

if the priority of the read out channel ID is lower than that of the determined channel ID, then the readout waveform probability value is set to 1, the readout channel ID is set to the determined channel ID, then the readout channel ID and the readout waveform probability value are stored back into the storage unit of mapping address $\tilde{A}_{in}^k$ in dual port RAM $J_{in}^k$;

if the priority of the read out channel ID is equal to that of the determined channel ID, then the readout waveform probability value is added by 1, the readout channel ID and the readout waveform probability value are stored back into the storage unit of mapping address $\tilde{A}_{in}^k$ in dual port RAM $J_{in}^k$;

if the priority of the read out channel ID is higher than that of the determined channel ID, then the readout waveform probability value is added by 1, the readout channel ID and the readout waveform probability value are stored back into the storage unit of mapping address $\tilde{A}_{in}^k$ in dual port RAM $J_{in}^k$;

4) judging whether RAM serial number $J_{in}^k$ is less than 4×N, if yes, then returning to step 3), otherwise, going to step 5);
5) judging whether f=L/(4×N'), if yes, then returning to step 6), otherwise, letting f=f+1 and returning to step 3);
6) judging whether c<C, if yes, then returning to step 2), otherwise, a waveform storage is completed, and outputting a waveform data output signal, where the C is a frame number for waveform mapping, which is set by the upper computer module;

a waveform date output module, when a waveform data output signal is outputted by the waveform data comparison and control module, the waveform data output control module sets waveform frame number c to 0, and then takes the control of the RAM array, sets the read mode of each dual port RAMs in the RAM array module to read_first mode, and then sends the waveform probability values outputted by RAM array module to the upper computer module, the upper computer module converts each waveform probability value into RBG values;

a display module, the upper computer module sends the RBG values of each waveform probability value to the display module, the display module displays the waveforms of input signals of four channels on a screen according the RBG values.

The objectives of the present invention are realized as follows:

In the present invention i.e. a system for data mapping and storing in digital three-dimensional oscilloscope, wherein the ADC module has four ADC submodules, which respectively acquire the input signals of the four channels. The four acquired waveform data are sent to an extraction module, the four extracted waveform data are buffered in a FIFO module. When a trigger signal arrives, the FIFO module outputs four extracted waveform data (FIFO output data) to a mapping address calculation module, the mapping address calculation module calculates a mapping address and a RAM serial number for each point data of FIFO output data in parallel, and the waveform data comparison and control module performs the reading and writing control of the 4×N dual port RAMs based on improved storage structure and storage logic. When mapping number reaches a frame number set by the upper computer module, the RAM array module outputs its waveform probability values to the upper computer module, the upper computer module converts each waveform probability value into RBG values, and the display module displays the waveforms of input signals of four channels on a screen according the RBG values.

Meanwhile, the present invention has the following advantageous features:

(1) The storage resource is saved through the improvements of the RAM array module, the storage structure and storage logic: in prior art, the storage of data of four channels needs four RAM array modules, however, in present invention, only one RAM array module is needed for data of four channels, the storage resource is saved by 4 times;

(2) The data of four channel are processed in parallel, which can fully and effectively make use of RAM resources, so the speed of storing and outputting waveform probability values is improved, leading to improvement of the waveform capture rate (WCR) of DTO;

(3) The method of parallel data process of four channels in the present invention is advantageous to the expansion of number of channels. It is only needed that four channels are packed into one set, and just multiple copied to complete the mapping of 3D waveform data of more channels. There is no need to redesign the processing flow, which further saves the processing time, improves the processing efficiency and the design time, and save the resources.

BRIEF DESCRIPTION OF THE DRAWING

The above and other objectives, features and advantages of the present invention will be more apparent from the following detailed description taken in conjunction with the accompanying drawings, in which.

DETAILED DESCRIPTION OF THE PREFERRED EMBODIMENT

Figure 1:
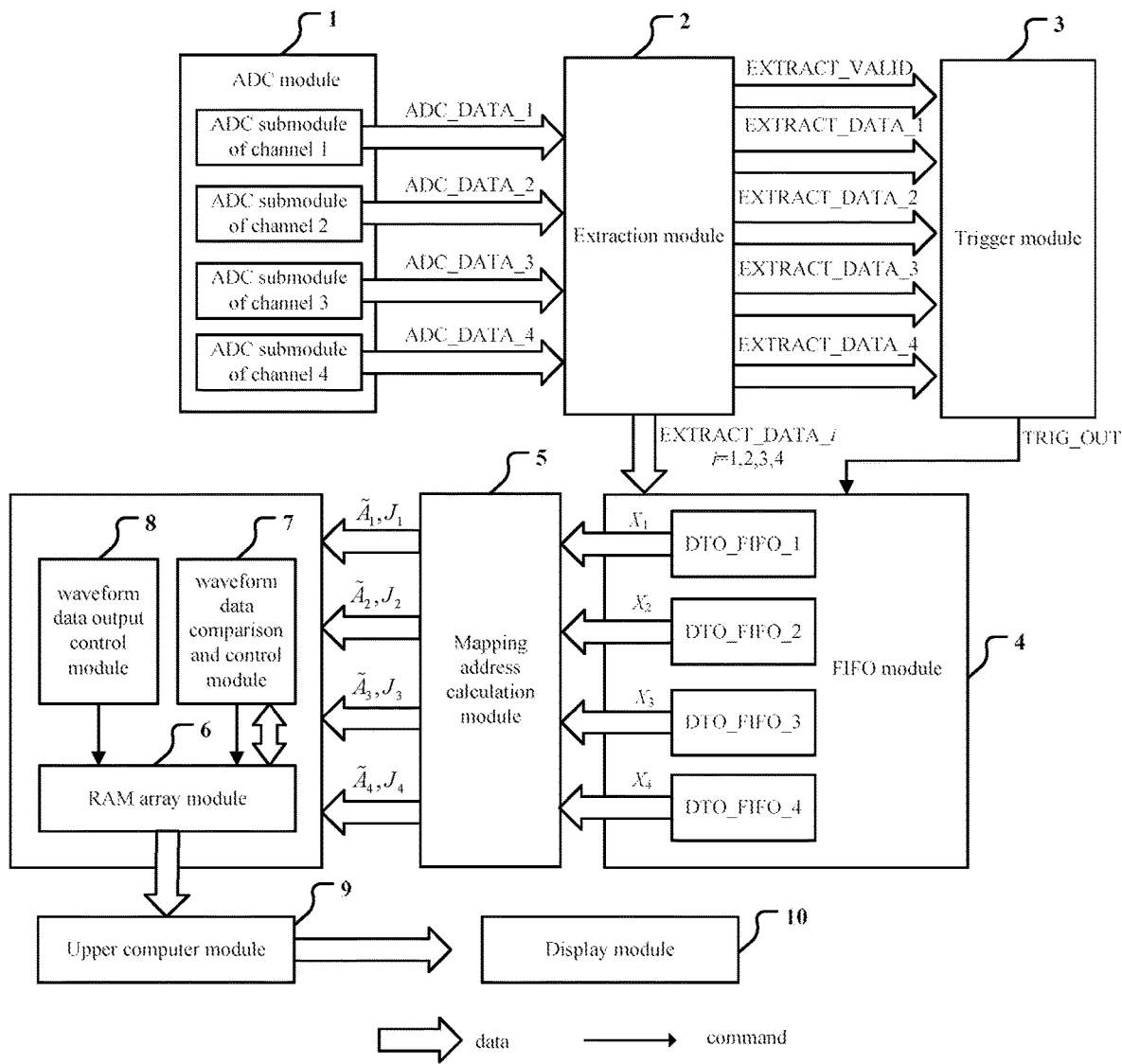
FIG. 1 is a diagram of a system for data mapping and storing in digital three-dimensional oscilloscope in accordance with the present invention.
Figure 2:
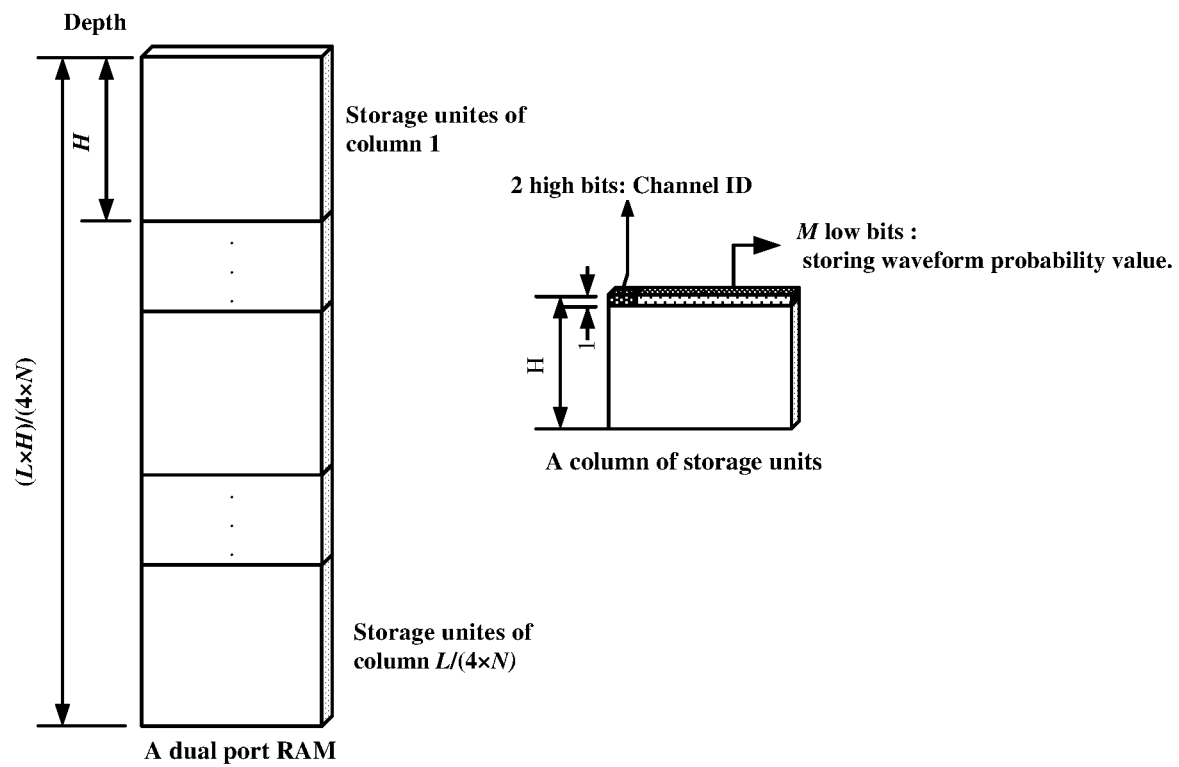
FIG. 2 is a diagram of a dual port RAM in accordance with the present invention.

Hereinafter, preferred embodiments of the present invention will be described with reference to the accompanying drawings. It should be noted that the similar modules are designated by similar reference numerals although they are illustrated in different drawings. Also, in the following description, a detailed description of known functions and configurations incorporated herein will be omitted when it may obscure the subject matter of the present invention.

Embodiment

FIG. 1 is a diagram of a system for data mapping and storing in digital three-dimensional oscilloscope in accordance with the present invention.

In one embodiment of the present invention, As shown in FIG. 1, a system for data mapping and storing in digital three-dimensional oscilloscope in accordance with the present invention comprises: an Analog-to Digital Converter (ADC) module 1, an extraction module 2, a trigger module 3, a first in, first out (FIFO) module 4, a mapping address calculation module 5, a RAM array module 6, a waveform data comparison and control module 7, a waveform data output control module 8, an upper computer module 9 and a display module 10. Each module is detailed as follows.

The ADC module 1 comprises four ADC submodules respectively corresponding to four channels. The four ADC submodules are respectively denoted by ADC submodule of channel 1, ADC submodule of channel 2, ADC submodule of channel 3 and ADC submodule of channel 4. The four ADC submodules respectively acquire the input signals of the four channels and output four waveform data ADC_DATA_1, ADC_DATA_2, ADC_DATA_3, ADC_DATA_4, the resolutions of the four ADC submodules all are M bits, the number of the data points outputted by an ADC submodule in one synchronization period of the data output synchronization clock is N.

The extraction module 2 receive the four waveform data ADC_DATA_1, ADC_DATA_2, ADC_DATA_3, ADC_DATA_4 and respectively extract data from them according to a divisor set by the upper computer module 9, and four extracted waveform data DATA_IN_1, DATA_IN_2, DATA_IN_3, DATA_IN_4 are obtained and denoted by extracted waveform data DATA_IN_i, i=1,2, . . . , 4 (they are inside extraction module 2, so not shown in FIG. 1), i is the serial number of channel. If the divisor is less than N, the extraction mode is denoted by extraction mode A, N points of data of an extracted waveform data DATA_IN_i are combined into one data of an extracted waveform data EXTRACT_DATA_i, the four extracted waveform data DATA_IN_i, i=1,2,3,4, are combined synchronously, and after a combination is complete, the extraction module 2 generates a valid data flag, the continuous valid data flags constitute a valid data flag signal EXTRACT_VALID; if the divisor is equal to N, the extraction mode is denoted by extraction mode B, one point of data of an extracted waveform data DATA_IN_i is taken as one data of an extracted waveform data EXTRACT DATA_i, the four extracted waveform data DATA_IN_i, i=1,2,3,4, are taken synchronously, and after a taking is complete, the extraction module 2 generates a valid data flag, the continuous valid data flags constitute a valid data flag signal EXTRACT_VALID.

Each ADC submodule of ADC module 1 outputs N points of data in one synchronization period of the data output synchronization clock $f_{sys}$. After extracting, the number of the data points extracted by the extraction module in one synchronization period is W. As shown in Table 1 and Table 2, if the divisor is less than N, W is different in different synchronization period. For the generality of application, N points of data of an extracted waveform data DATA_IN_i are combined into one data of an extracted waveform data EXTRACT_DATA_i.

TABLE 1

|  | 5G/divisor = 5 | | | | | Extracted waveform data point |
|---|---|---|---|---|---|---|
| Waveform data point | 1 | 17 | 33 | 49 | 65 | 5 |
|  | 2 | 18 | 34 | 50 | 66 | 10 |
|  | 3 | 19 | 35 | 51 | 67 | 15 |
|  | 4 | 20 | 36 | 52 | 68 | 20 |
|  | 5 | 21 | 37 | 53 | 69 | 25 |
|  | 6 | 22 | 38 | 54 | 70 | 30 |
|  | 7 | 23 | 39 | 55 | 71 | 35 |
|  | 8 | 24 | 40 | 56 | 72 | 40 |
|  | 9 | 25 | 41 | 57 | 73 | 45 |
|  | 10 | 26 | 42 | 58 | 74 | 50 |
|  | 11 | 27 | 43 | 59 | 75 | 55 |
|  | 12 | 28 | 44 | 60 | 76 | 60 |
|  | 13 | 29 | 45 | 61 | 77 | 65 |
|  | 14 | 30 | 46 | 62 | 78 | 70 |
|  | 15 | 31 | 47 | 63 | 79 | 75 |
|  | 16 | 32 | 48 | 64 | 80 | 80 |
| Synchronization period | 1 | 2 | 3 | 4 | 5 |  |
|  | Repositioned extracted Waveform data point | | | | | |
|  | 5 | 20 | 35 | 50 | 65 | |
|  | 10 | 25 | 40 | 55 | 70 | |
|  | 15 | 30 | 45 | 60 | 75 | |
|  |  |  |  |  | 80 | |
| W | 3 | 3 | 3 | 3 | 4 | |

ⓐ A valid data flag is generated at the interval of 5 synchronization periods

As shown in Table 1, N=16 and the divisor is 5, W is 3, 3, 3, 3, 4 in synchronization period 1, 2, 3, 4, 5, a valid data flag is generated at the interval of 5 synchronization periods.

TABLE 2

|  | 5G/divisor =10 | | | | | | | | | | Extracted waveform data point |
|---|---|---|---|---|---|---|---|---|---|---|---|
| Waveform data point | 1 | 17 | 33 | 49 | 65 | 81 | 97 | 113 | 129 | 145 | 10 |
|  | 2 | 18 | 34 | 50 | 66 | 82 | 98 | 114 | 130 | 146 | 20 |
|  | 3 | 19 | 35 | 51 | 67 | 83 | 99 | 115 | 131 | 147 | 30 |
|  | 4 | 20 | 36 | 52 | 68 | 84 | 100 | 116 | 130 | 148 | 40 |
|  | 5 | 21 | 37 | 53 | 69 | 85 | 101 | 117 | 133 | 149 | 50 |
|  | 6 | 22 | 38 | 54 | 70 | 86 | 102 | 118 | 134 | 150 | 60 |
|  | 7 | 23 | 39 | 55 | 71 | 87 | 103 | 119 | 135 | 151 | 70 |
|  | 8 | 24 | 40 | 56 | 72 | 88 | 104 | 120 | 136 | 152 | 80 |
|  | 9 | 25 | 41 | 57 | 73 | 89 | 105 | 121 | 137 | 153 | 90 |
|  | 10 | 26 | 42 | 58 | 74 | 90 | 106 | 122 | 138 | 154 | 100 |
|  | 11 | 27 | 43 | 59 | 75 | 91 | 107 | 123 | 139 | 155 | 110 |
|  | 12 | 28 | 44 | 60 | 76 | 92 | 108 | 124 | 140 | 156 | 120 |
|  | 13 | 29 | 45 | 61 | 77 | 93 | 109 | 125 | 141 | 157 | 130 |
|  | 14 | 30 | 46 | 62 | 78 | 94 | 110 | 126 | 142 | 158 | 140 |
|  | 15 | 31 | 47 | 63 | 79 | 95 | 111 | 127 | 143 | 169 | 150 |
|  | 16 | 32 | 48 | 64 | 80 | 96 | 112 | 128 | 144 | 160 | 160 |
| Synchronization period | 1 | 2 | 3 | 4 | 5 | | | | | | |
|  | Repositioned extracted Waveform data point | | | | | | | | | | |
|  | 10 | 20 | 40 | 50 | 70 | 90 | 100 | 120 | 130 | 150 | |
|  | 30 |  | 60 | 80 |  |  | 110 |  | 140 | 160 | |
| W | 1 | 2 | 1 | 2 | 2 | 1 | 2 | 1 | 2 | 2 | |

ⓐ A valid data flag is generated at the interval of 6 synchronization periods

As shown in Table 2, N=16 and the divisor is 10, W is 1, 2, 1, 2, 2, 1, 2, 1, 2, 2 in synchronization period 1, 2, 3, 4, 5, 6, 7, 8, 9, 10, a valid data flag 5 is generated at the interval of 10 synchronization periods The extraction module 2 sends the four extracted waveform data EXTRACT_DATA_i, i=1,2,3,4, which respectively correspond to channel 1, channel 2, channel 3 and channel 4, and the valid data flag signal EXTRACT_VALID to the trigger module 3. And the trigger module 3 generates a trigger signal TRIG_OUT according to a plurality of trigger parameters and a trigger channel set by the upper computer module 9. Take the edge trigger, one of the most common triggers, for example, the upper computer module 9 sends a trigger level and a trigger channel to the trigger module 3. In the embodiment, suppose the trigger channel is channel 2, the trigger module 3 monitors the extracted waveform data EXTRACT_DATA_2, when it varies from the level lower than trigger level to the level higher than trigger level, the trigger module 3 generates a trigger signal TRIG_OUT, and the trigger signal TRIG_OUT will last one clock period, and then turns to lower level.

The extraction module 2 delays, and then sends the four extracted waveform data EXTRACT_DATA_i, i=1,2,3,4, and the valid data flag signal EXTRACT_VALID to the FIFO module 4. The purpose of the delay is to synchronize the four extracted waveform data EXTRACT_DATA_i, i=1, 2,3,4, and the valid data flag signal EXTRACT_VALID with the trigger signal TRIG_OUT.

the trigger module 3 sends the trigger signal TRIG_OUT to the FIFO module 4. the FIFO module 4 comprises four FIFO submodules DTO_FIFO_i, i=1,2,3,4, respectively corresponding to four extracted waveform data EXTRACT_DATA_i, i=1,2,3,4. The FIFO module 4 buffers the four extracted waveform data EXTRACT_DATA_i, i=1,2,3,4, according to the valid data flag signal EXTRACT_VALID and the trigger signal TRIG_OUT: when the valid data flag signal EXTRACT_VALID is turned into high level (a valid data flag appears), the four FIFO modules enter write mode, the four extracted waveform data EXTRACT_DATA_i, i=1, 2,3,4, are respectively written into corresponding FIFO submodules DTO_FIFO_i, i=1,2,3,4, when the amount of the data written into the four FIFO submodules reaches a pre-trigger depth which is set by the upper computer module 9. The four FIFO modules enter read-while-write mode; when a trigger signal TRIG_OUT arrives, the four FIFO submodules continuously output their extracted waveform data, which are denoted by FIFO output data $X_i$, i=1,2,3,4, until a frame of extracted waveform data am completely outputted. At the same time, the FIFO module 4 generates a valid output data flag upon one extracted waveform data output, the continuous valid output data flags constitute a valid output data flag signal FIFO_VALID.

The mapping address calculation module 5 receives FIFO output data $X_i$, i=1,2,3,4, and valid output data flag signal FIFO_VALID, and then calculates a mapping address and a RAM serial number for each point data of FIFO output data $X_i$, i=1,2,3,4, in parallel:

1): setting valid output data flag number k to 1;

2): monitoring the valid output data flag signal FIFO_VALID, when the valid output data flag signal FIFO_VALID is turned into high level (a valid output data flag appears), which means FIFO output data $X_i$, i=1,2,3,4, are valid, then going to step 3);

3): initializing data serial number n to 1;

4): calculating serial number $j_{in}^k$ of $n^{th}$ point data $X_{in}^k$ of $k^{th}$ data $X_i^k$ of FIFO output data $X_i$ in a screen of data points: $j_{in}^k=(k-1)N'+n$, where N'=N, if the extraction mode is extraction mode A, N'=1, if the extraction mode is extraction mode B; for extraction mode A, $k^{th}$ data $X_i^k$ of FIFO output data $X_i$ has N point data, so N'=N, for extraction mode B, $k^{th}$ data $X_i^k$ of FIFO output data $X_i$ has 1 point data, so N'=1; N' is the number of points data of data of FIFO output data;

5): calculating address (location) $A_{in}^k$ in 3D waveform database according to point data $X_{in}^k$; the calculation of address (location) in 3D waveform database is a prior art;

6): calculating mapping address $\tilde{A}_{in}^k$ and a RAM serial number $J_{in}^k$ for point data $X_{in}^k$: $\tilde{A}_{in}^k=A_{in}^k+(f-1)H$, $J_{in}^k=j_{in}^k-(f-1)\times(4\times N)$, where f is the cycle number at the time of current calculation, which is sent to the mapping address calculation module 5 by the waveform data comparison and control module 7, where H is the number of vertical points of the screen of DTO;

7): judging whether n<N', if yes, then letting n=n+1 and returning to step 4), otherwise, going to step 8);

8): judging whether k<K, if yes, then letting k=k+1 and returning to step 2), otherwise, going to step 1), where K=L/N under the circumstance that the extraction mode is extraction mode A, or K=L under the circumstance that the extraction mode is extraction mode B, L is the number of horizontal points of the screen of DTO. All mapping address $\tilde{A}_{in}^k$ of channel i constitute a mapping address signal $\tilde{A}_i$, for channel 1, 2, 3, 4, the corresponding mapping address signal are $\tilde{A}_1, \tilde{A}_2, \tilde{A}_3, \tilde{A}_4$, respectively. All RAM serial number $J_{in}^k$ of channel i constitute a RAM serial number signal $J_i$, for channel 1, 2, 3, 4, the corresponding RAM serial number signal are $J_1, J_2, J_3, J_4$ respectively.

Figure 3:
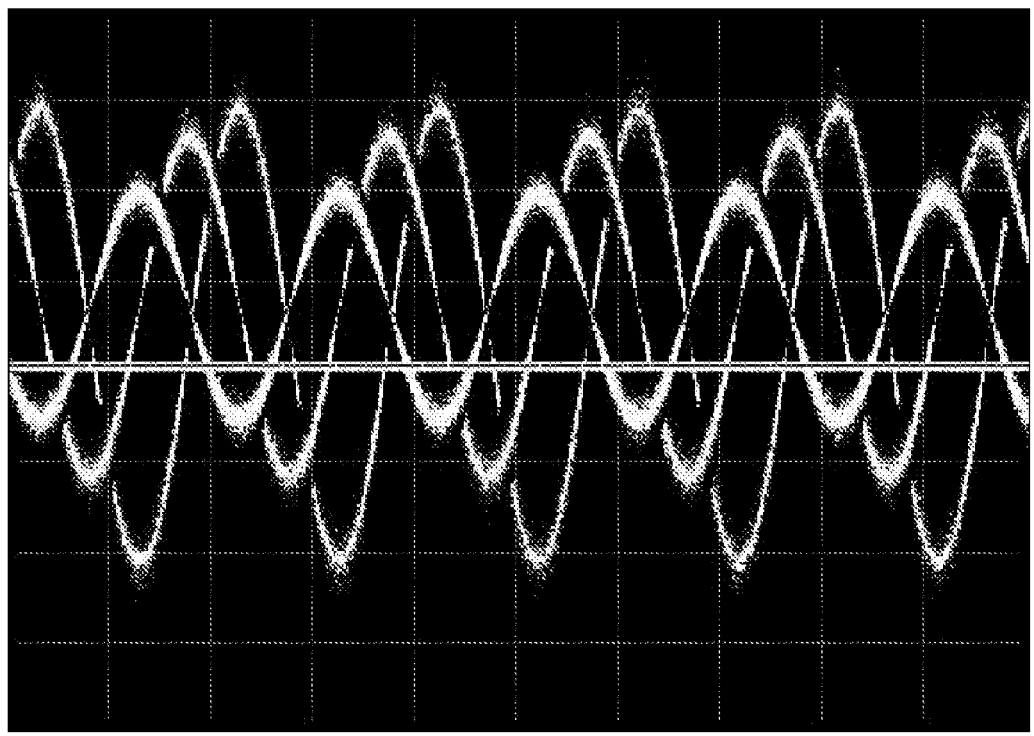
FIG. 3 is a diagram of waveforms of four channels displayed on screen in accordance with the present invention.
Figure 4:
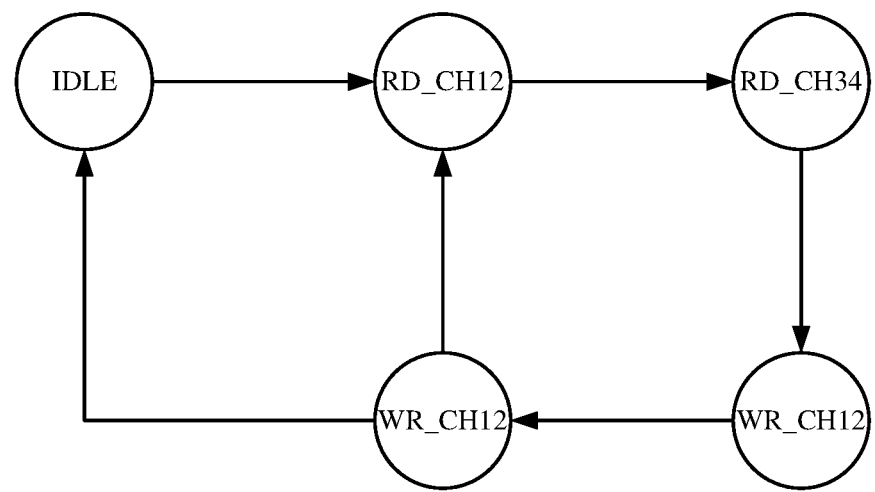
FIG. 4 is a diagram of a state machine in accordance with one embodiment of the present invention.

The RAM array module 6 comprises N RAM arrays, each RAM array has dual port RAMs, so The RAM array module 6 comprises 4×N dual port RAMs. As shown in FIG. 3, the address depth of each dual port RAM is L×H/(4×N), i.e. a dual port RAM has L×H/(4×N) storage units. Each dual port RAM is used to store L/(4×N) columns of waveform probability values, and a column of waveform probability values comprise H waveform probability values which are stored into H storage units. The bit-width of the storage unit corresponding to an address of dual port RAM is 2+M, where the 2 high bits are used for storing the channel ID, the M low bits are used for storing waveform probability value.

The waveform data comparison and control module 7 comprises 4×N waveform data comparison modules, which respectively correspond to the 4×N dual port RAMs. The waveform data comparison and control module 7 performs the parallel reading and writing control of the 4×N dual port RAMs as follows:

1): initializing waveform frame number c to 1;

2): initializing circle number f to 1;

3): comparing and processing the waveform probability values in 4×N dual port RAMs; after each four pairs of mapping address $\tilde{A}_{in}^k$ and RAM serial number $J_{in}^k$, i=1,2, 3,4, are calculated, the mapping address calculation module 5 reduces the rate of the four pairs of mapping address $\tilde{A}_{in}^k$ and RAM serial number $J_{in}^k$, i=1,2,3,4, by 4 times, and send the four pairs of mapping address $\tilde{A}_{in}^k$ and RAM serial number $J_{in}^k$, i=1,2,3,4, to the RAM array module 6 and the waveform data comparison and control module 7 in parallel; for each channel, the waveform data comparison and control module 7 determines a channel ID (determined channel ID) by the channel corresponding to point data $X_{in}^k$, then sends the determined channel ID to waveform data comparison module $J_{in}^k$; at the same time, the waveform data comparison and control module 7 reads out a channel ID (readout channel ID) and a waveform probability value (readout waveform probability value) from a storage unit of dual port RAM $J_{in}^k$ according to mapping address $\tilde{A}_{in}^k$, and then sends the readout channel ID and the readout waveform probability value to waveform data comparison module $J_{in}^k$; waveform data comparison module $J_{in}^k$ processes the readout channel IDs and the readout waveform probability values according to the following three conditions:

if the priority of the read out channel ID is lower than that of the determined channel ID, then the readout waveform probability value is set to 1, the readout channel ID is set to the determined channel ID, then the readout channel ID and the readout waveform probability value are stored back into the storage unit of mapping address $\tilde{A}_{in}^k$ in dual port RAM $J_{in}^k$;

if the priority of the read out channel ID is equal to that of the determined channel ID, then the readout waveform probability value is added by 1, the readout channel ID and the readout waveform probability value are stored back into the storage unit of mapping address $\tilde{A}_{in}^k$ in dual port RAM $J_{in}^k$;

if the priority of the read out channel ID is higher than that of the determined channel ID, then the readout waveform probability value is added by 1, the readout channel ID and the readout waveform probability value are stored back into the storage unit of mapping address $\tilde{A}_{in}^{k}$ in dual port RAM $J_{in}^{k}$;

4) judging whether RAM serial number $J_{in}^{k}$ is less than 4×N if yes, then returning to step 3), otherwise, going to step 5);

5) judging whether f=L/(4×N'), if yes, then returning to step 6), otherwise, letting f=f+1 and returning to step 3);

6) judging whether c<C, if yes, then returning to step 2), otherwise, a waveform storage is completed, and outputting a waveform data output signal, where the C is a frame number for waveform mapping, which is set by the upper computer module.

When a waveform data output signal is outputted by the waveform data comparison and control module 7, the waveform data output control module 8 sets waveform frame number c to 0, and then takes the control of the RAM array module 6, sets the read mode of each dual port RAMs in the RAM array module 6 to read_first mode (the RAM array module 6 output the waveform probability values), and then sends the waveform probability values outputted by RAM array module 6 to the upper computer module 9. The upper computer module 9 converts each waveform probability value into RBG values.

The upper computer module 9 sends the RBG values of each waveform probability value to display module 10, the display module 10 displays the waveforms of input signals of four channels on a screen according the RBG values.

The waveform data comparison and control module 7 is a very important module in the present invention. In order to make it run more efficiently, a state machine for processing the parallel data of the four channels is developed in the embodiment, which has 5 states of IDLE, RD_CH12, RD_CH34, WR_CH12, WR_CH34. The 5 states are detailed as follows.

The state of IDLE is a initial state. When the waveform data comparison and control module 7 receives four pairs of mapping address $\tilde{A}_{in}^{k}$ and RAM serial number $J_{in}^{k}$, the state machine goes into the state of RD_CH12.

The state of RD_CH12 is a state of parallel reading out channel IDs and waveform probability values of channel 1 and channel 2. Under the state of RD_CH12, the waveform data comparison and control module 7 reads out a channel ID (readout channel ID) and a waveform probability value (readout waveform probability value) from a storage unit of dual port RAM $J_{in}^{k}$ according to mapping address $\tilde{A}_{in}^{k}$, and reads out a channel ID (readout channel ID) and a waveform probability value (readout waveform probability value) from a storage unit of dual port RAM $J_{2n}^{k}$ according to mapping address $\tilde{A}_{in}^{k}$. After one clock period, the state machine goes into the state of RD_CH34. In the present invention, the four channels operate synchronously, the RAM serial numbers of channel 1 and channel 2 at same time are the same. However, the dual port RAM can read out and write back the data (channel ID and waveform probability value) of the two channels.

The state of RD_CH34 is a state of parallel reading out the channel IDs and waveform probability values of channel 3 and channel 4. Under the state of RD_CH34, the waveform data comparison and control module 7 reads out a channel ID (readout channel ID) and a waveform probability value (readout waveform probability value) from a storage unit of dual port RAM $J_{3n}^{k}$ according to mapping address $\tilde{A}_{in}^{k}$, and reads out a channel ID (readout channel ID) and a waveform probability value (readout waveform probability value) from a storage unit of dual port RAM $J_{4n}^{k}$ according to mapping address $\tilde{A}_{in}^{k}$. At the same time, the waveform data comparison and control module 7 processes the readout channel ID and the waveform probability values of channel 1 and channel 2 according to the three conditions. After one clock period, the state machine goes into the state of WR_CH12.

The state of WR_CH12 is a state of parallel writing back the readout channel IDs and the readout waveform probability values of channel 1 and channel 2. Under the state of WR_CH12, the waveform data comparison and control module 7 writes back the readout channel IDs and readout waveform probability values of channel 1 and channel 2 to the storage units of corresponding addresses in dual port RAM. In case of the storage units for channel 1 and channel 2 are the same, only the readout channel ID and the readout waveform probability value of the channel with higher priority are stored back. At the same time, the waveform data comparison and control module 7 processes the readout channel IDs and the waveform probability values of channel 3 and channel 4 according to the three conditions. After one clock period, the state machine goes into the state of WR_CH34.

The state of WR_CH34 is a state of parallel writing back the readout channel IDs and the readout waveform probability values of channel 3 and channel 4. Under state of WR_CH34, the waveform data comparison and control module 7 writes back the readout channel IDs and the readout waveform probability values of channel 3 and channel 4 to the storage units of corresponding addresses in dual port RAM. In case of the storage units for channel 3 and channel 4 are the same, only the readout channel ID and the readout waveform probability value of the channel with higher priority are stored back. After one clock period, judging whether c<C, if yes, the state machine goes into the state of RD_CH12, otherwise, the state machine returns to the state of IDLE.

The operations of processing the parallel data of the four channels are shown in table 1.

TABLE 3

| Clock period | 1 | 2 | 3 | 4 |
| --- | --- | --- | --- | --- |
| State | RD_CH12 | RD_CH34 | WR_CH12 | WR_CH34 |
| Operations of channel 1 and channel 2 | Parallel reading out the corresponding data of channel 1 and channel 2 | Parallel processing the corresponding data of channel 1 and channel 2 | Parallel writing back the parallel data of channel 1 and channel 2 | |
| Operations of channel 3 and channel 4 | | Parallel reading out the corresponding data of channel 3 and channel 4 | Parallel processing the corresponding data of channel 1 and channel 2 | Parallel writing back the parallel data of channel 3 and channel 4 |

As shown in Table 3, the parallel data of the four channels are processed (read out and written back) repeatedly at the interval of 4 clock periods.

In order to better describe the present invention, a more detailed example are given, and elaborated as follows:

Step 1: user sets a time base by the upper computer module 9. The upper computer module 9 resets the FIFO module 4, the RAM array module 6, the waveform data comparison and control module 7 and the waveform data output control module 8. After the resetting is completed, the upper computer module 9 calculates a divisor according to the time base, and sends the divisor to the extraction module 2. In the present example, the divisor is 5. The upper computer module 9 sets a plurality of trigger parameters and a trigger channel for the trigger module 3. The plurality of trigger parameters include edge trigger and trigger level, the trigger channel is channel 1 in the present example. The upper computer module 9 sends pre-trigger depth of 201 to the FIFO module 4. In the meantime, the upper computer module 9 sets the priorities of the four channels. The bigger the channel ID is, the higher the priority of the corresponding channel is. The upper computer module 9 sends the priorities of the four channels and the frame number for waveform mapping C=255 to the waveform data comparison and control module 7.

In the present example, the resolutions of screen is L×H=512×256, the number L of horizontal points of the screen of DTO is 512, the resolutions of the four ADC submodules all are M=8 bits, the data output synchronization clock $f_{xyz}$=312.5 MHz, the number of the data points output by an ADC submodule in one synchronization period of the data output synchronization clock is N=16.

Step 2: The ADC module 1 acquires the input signals of the four channels and output four waveform data ADC_DATA_1, ADC_DATA_2, ADC_DATA_3, ADC_DATA_4 to the extraction module 2. The extraction module 2 extracts data from them according to the divisor of 5, and four extracted waveform data DATA_IN_1, DATA_IN_2, DATA_IN_3, DATA_IN_4 are obtained. The divisor is 5 and less than 16, so the extraction mode is extraction mode A. Then 16 points of data of an extracted waveform data DATA_IN_i are combined into one data of an extracted waveform data EXTRACT_DATA_i, each data of an extracted waveform data is a date of 16×8=128 bits, it comprises 16 point data. After a combination is complete, the extraction module 2 generates a valid data flag, the continuous valid data flags constitute a valid data flag signal EXTRACT_VALID.

Step 3: the trigger module 3 monitors extracted waveform data EXTRACT_DATA_1, which are sent by the extraction module 2, when extracted waveform data EXTRACT_DATA_1 is turned into high level, the trigger module 3 generates a trigger signal TRIG_OUT, and sends it to the FIFO module 4, and the trigger signal TRIG_OUT will last one clock period, and then turns to lower level.

Step 4: the extraction module 2 delays, and then sends the four extracted waveform data EXTRACT_DATA_i, i=1, 2,3,4, and the valid data flag signal EXTRACT_VALID to the FIFO module 4. The purpose of the delay is to synchronize the four extracted waveform data EXTRACT_DATA_i, i=1, 2,3,4, and the valid data flag signal EXTRACT_VALID with the trigger signal TRIG_OUT.

The FIFO module 4 buffers the four extracted waveform data EXTRACT_DATA_i, i=1,2,3,4, according to the valid data flag signal EXTRACT_VALID and the trigger signal TRIG_OUT: when the valid data flag signal EXTRACT_VALID is turned into high level (a valid data flag appears), the four FIFO modules enter write mode, the four extracted waveform data EXTRACT_DATA_i, i=1,2, 3,4, are respectively written into corresponding FIFO submodules DTO_FIFO_i, i=1,2,3,4, when the amount of the data written into the four FIFO submodules reaches a pre-trigger depth which is set by the upper computer module 9. The four FIFO modules enter read-while-write mode; when a trigger signal TRIG_OUT arrives, the four FIFO submodules continuously output their extracted waveform data, which are denoted by FIFO output data $X_i$, i=1,2,3,4, until a frame of extracted waveform data are completely outputted. At the same time, the FIFO module 4 generates a valid output data flag upon one extracted waveform data output, the continuous valid output data flags constitute a valid output data flag signal FIFO_VALID. The FIFO output data $X_i$, i=1,2,3,4, along with the valid output data flag signal FIFO_VALID are sent to the mapping address calculation module 5.

Step 5: When the valid output data flag signal FIFO_VALID is turned into high level (a valid output data flag appears), the mapping address calculation module 5 calculates a serial number $j_{in}^k$ of $n^{th}$ point data $X_{in}^k$ of $k^{th}$ data $X_i^k$ of FIFO output data $X_i$ in a screen of data points: $j_{in}^k$=(k−1)N'+n=(k−1)×16+n and an address (location) $A_{in}^k$ in 3D waveform database according to point data $X_{in}^k$, and then calculates a mapping address: $\tilde{A}_{in}^k = A_{in}^k+(f-1)\times 256$ and a RAM serial number: $J_{in}^k = j_{in}^k - (f-1)\times 64$ according to the cycle number f at the time of current calculation. The mapping address calculation module 5 reduces the rate of the four pairs of mapping address $\tilde{A}_{in}^k$ and RAM serial number $J_{in}^k$, i=1,2,3,4, by 4 times, and send the four pairs of mapping address $\tilde{A}_{in}^k$ and RAM serial number $J_{in}^k$, i=1,2,3,4 to the RAM array module 6 and the waveform data comparison and control module 7 in parallel.

Step 6: the waveform data comparison and control module 7 performs the parallel reading and writing control of the 4×N dual port RAMs. Ater 255 frames of waveform mapping are completed. i.e. 255 frames of waveform data are stored into the RAM army module 6, the control of the RAM array module 6 is transferred to the waveform data output control module 8.

Figure 5:
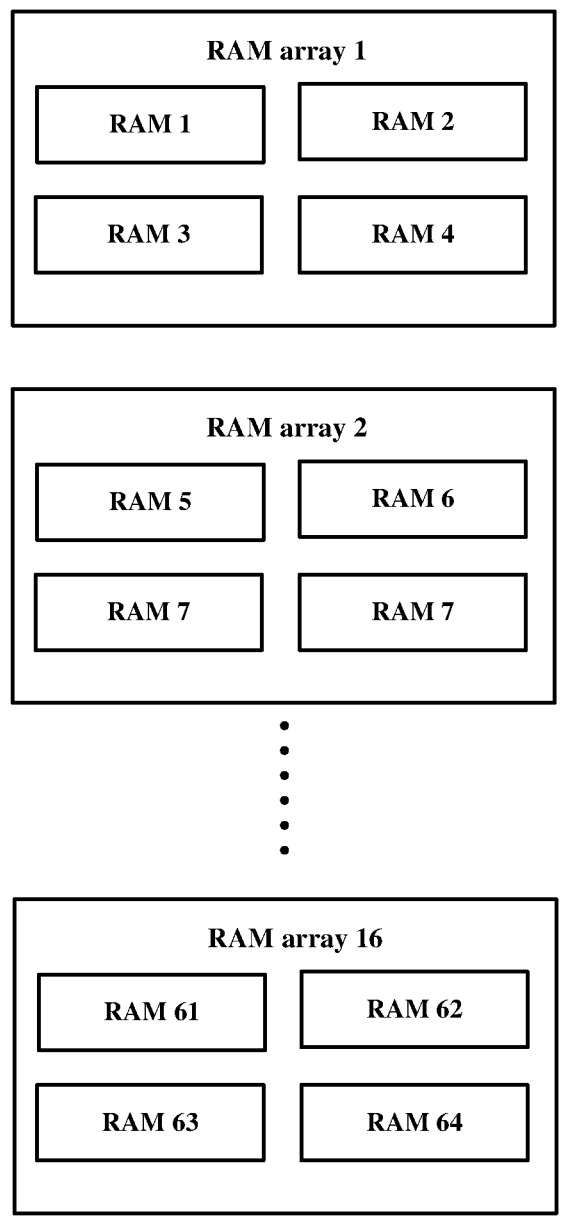
FIG. 5 is a diagram of a RAM array module in accordance with the present invention.

In the present example, as shown in FIG. 5, for N=16, the RAM array module 6 comprises 16 RAM arrays, each RAM array has 4 dual port RAM, therefore, the RAM array module 6 comprises 4×16=64 dual port RAMs. The address depth of each dual port RAM is L×H/(4×N)=512×256/(4×16)=2048. The bit-width of the storage unit corresponding to an address of dual port RAM is 2+M=2+8=10, where the 2 high bits are used for storing the channel ID, the 8 low bits are used for storing waveform probability value. To the 64 dual port RAMs, RAM 1 is used to store the waveform probability values of the $1^{st}$, $65^{th}$, $129^{th}$, . . . , $449^{th}$ columns of the screen, RAM 2 is used to store the waveform probability values of the $2^{nd}$, $66^{th}$, $130^{th}$, . . . , $450^{th}$ columns of the screen, RAM 3 is used to store the waveform probability values of the $3^{rd}$, $67^{th}$, $131^{th}$, . . . , $451^{th}$ columns of the screen, . . . , RAM 64 is used to store the waveform probability values of the $64^{th}$, $128^{th}$, $192^{th}$, . . . , $512^{th}$ columns of the screen.

Step 7: The waveform data output control module 8 sets the waveform frame number c to 0, and then takes the control of the RAM array module 6, sets the read mode of each dual port RAMs in the RAM array module 6 to read_first mode, the RAM array module 6 output the waveform probability values, and then sends the waveform probability values outputted by RAM array module 6 to the upper computer module 9. The upper computer module 9 converts each waveform probability value into RBG values, and sends the RBG values of each waveform probability value to display module 10.

Step 8: The display module 10 displays the waveforms of input signals of four channels on a screen according the RBG values While illustrative embodiments of the invention have been described above, it is, of course, understand that various modifications will be apparent to those of ordinary skill in the art. Such modifications are within the spirit and scope of the invention, which is limited and defined only by the appended claims.

What is claimed is:

1. A system for data mapping and storing in digital three-dimensional oscilloscope, comprising:
an upper computer module;
an Analog-to-Digital Convertor (ADC) module, which comprises four ADC submodules respectively corresponding to four channels, wherein the four ADC submodules respectively acquire the input signals of the four channels and output four waveform data ADC_DATA_1, ADC_DATA_2, ADC_DATA_3, ADC_DATA_4, the resolutions of the four ADC submodules all are M bits, the number of the data points outputted by an ADC submodule in one synchronization period of the data output synchronization clock is N;
an extraction module, wherein the extraction module receive the four waveform data ADC_DATA_1, ADC_DATA_2, ADC_DATA_3, ADC_DATA_4 and respectively extract data from them according to a numerical divisor set by the upper computer module, and four extracted waveform data DATA_IN_1, DATA_IN_2, DATA_IN_3, DATA_IN_4 are obtained and denoted by extracted waveform data DATA_IN_i, i=1,2,3,4, i is the serial number of channel; if the divisor is less than N, the extraction mode is denoted by extraction mode A, N points of data of an extracted waveform data DATA_IN_i are combined into one data of an extracted waveform data EXTRACT_DATA_i, the four extracted waveform data DATA_IN_i, i=1,2,3,4, are combined synchronously, and after a combination is complete, the extraction module generates a valid data flag, the continuous valid data flags constitute a valid data flag signal EXTRACT_VALID; if the divisor is equal to N, the extraction mode is denoted by extraction mode B, one point of data of an extracted waveform data DATA_IN_i is taken as one data of an extracted waveform data EXTRACT DATA_i, the four extracted waveform data DATA_IN_i, i=1,2,3,4, are taken synchronously, and after a taking is complete, the extraction module generates a valid data flag, the continuous valid data flags constitute a valid data flag signal EXTRACT_VALID;
a trigger module, wherein the extraction module sends the four extracted waveform data EXTRACT_DATA_i, i=1,2,3,4, and the valid data flag signal EXTRACT_VALID to the trigger module, and the trigger module generates a trigger signal TRIG_OUT according to a plurality of trigger parameters and a trigger channel set by the upper computer module;
a first in, first out (FIFO) module, wherein the extraction module delays, and then sends the four extracted waveform data EXTRACT_DATA_i, i=1,2,3,4, and the valid data flag signal EXTRACT_VALID to the FIFO module, the trigger module sends the trigger signal TRIG_OUT to the FIFO module; the FIFO module comprises four FIFO submodules DTO_FIFO_i, i=1, 2,3,4, respectively corresponding to four extracted waveform data EXTRACT_DATA_i, i=1,2,3,4, the FIFO module buffers the four extracted waveform data EXTRACT_DATA_i, i=1,2,3,4, according to the valid data flag signal EXTRACT_VALID and the trigger signal TRIG_OUT: when the valid data flag signal EXTRACT_VALID is turned into high level, the four FIFO modules enter write mode, the four extracted waveform data EXTRACT_DATA_i, i=1,2,3,4, are respectively written into corresponding FIFO submodules DTO_FIFO_i, i=1,2,3,4, when the amount of the data written into the four FIFO submodules reaches a pre-trigger depth which is set by the upper computer module, the four FIFO modules enter read-while-write mode; when a trigger signal TRIG_OUT arrives, the four FIFO submodules continuously output their extracted waveform data, which are denoted by FIFO output data $X_i$, i=1,2,3,4, until a frame of extracted waveform data are completely outputted, at the same time, the FIFO module generates a valid output data flag upon one extracted waveform data output, the continuous valid output data flags constitute a valid output data flag signal FIFO_VALID;
a mapping address calculation module, wherein the mapping address calculation module receives FIFO output data $X_i$, i=1,2,3,4, and valid output data flag signal FIFO_VALID, and then calculates a mapping address and a RAM serial number for each point data of FIFO output data $X_i$, i=1,2,3,4, in parallel:
1): setting valid output data flag number k to 1;
2): monitoring the valid output data flag signal FIFO_VALID, when the valid output data flag signal FIFO_VALID is turned into high level, which means FIFO output data $X_i$, i=1,2,3,4, are valid, then going to step 3);
3): initializing data serial number n to 1;
4): calculating serial number $j_{in}^k$ of $n^{th}$ point data $X_{in}^k$, of $k^{th}$ data $X_i^k$ of FIFO output data $X_i$ in a screen of data points: $j_{in}^k=(k-1)N'+n$, where N'=N, if the extraction mode is extraction mode A, N'=1, if the extraction mode is extraction mode B;
5): calculating address $A_{in}^k$ in 3D waveform database according to point data $X_{in}^k$;
6): calculating mapping address $\tilde{A}_{in}^k$ and RAM serial number $J_{in}^k$ for point data $X_{in}^k$: $\tilde{A}_{in}^k=A_{in}^k+(f-1)H$, $J_{in}^k=j_{in}^k-(f-1)\times(4\times N)$, where f is the cycle number at the time of current calculation, where H is the number of vertical points of the screen of DTO;
7): judging whether n<N', if yes, then letting n=n+1 and returning to step 4), otherwise, going to step 8);
8): judging whether k<K, if yes, then letting k=k+1 and returning to step 2), otherwise, going to step 1), where K=L/N under the circumstance that the extraction mode is extraction mode A, or K=L under the circumstance that the extraction mode is extraction mode B, L is the number of horizontal points of the screen of DTO;
a RAM array module, wherein the RAM array module comprises 4×N dual port RAMs, the address depth of each dual port RAM is L×H/(4×N), the bit-width of the storage unit corresponding to an address of dual port RAM is 2+M, where the 2 high bits are used for storing the channel ID, the M low bits are used for storing waveform probability value;
a waveform data comparison and control module, wherein the waveform data comparison and control module comprises 4×N waveform data comparison modules, which respectively correspond to the 4×N dual port RAMs, the waveform data comparison and control module performs the parallel reading and writing control of the 4×N dual port RAMs as follows:
1): initializing waveform frame number c to 1;
2): initializing circle number f to 1;
3): comparing and processing the waveform probability values in 4×N dual port RAMs: after each four pairs of mapping address $\tilde{A}_{in}^{k}$ and RAM serial number $J_{in}^{k}$, i=1,2,3,4, are calculated, the mapping address calculation module reduces the rate of the four pairs of mapping address $\tilde{A}_{in}^{k}$ and RAM serial number $J_{in}^{k}$, i=1,2,3,4, by 4 times, and send the four pairs of mapping address $\tilde{A}_{in}^{k}$ and RAM serial number $J_{in}^{k}$, i=1,2,3,4, to the RAM array module and the waveform data comparison and control module in parallel; for each channel, the waveform data comparison and control module determines a channel ID by the channel corresponding to point data $X_{in}^{k}$, then sends the determined channel ID to waveform data comparison module $J_{in}^{k}$; at the same time, the waveform data comparison and control module reads out a channel ID and a waveform probability value from a storage unit of dual port RAM $J_{in}^{k}$ according to mapping address $\tilde{A}_{in}^{k}$, and then sends the readout channel ID and the readout waveform probability value to waveform data comparison module $J_{in}^{k}$; waveform data comparison module $J_{in}^{k}$ processes the readout channel IDs and the waveform probability values according to the following three conditions:

if the priority of the read out channel ID is lower than that of the determined channel ID, then the readout waveform probability value is set to 1, the readout channel ID is set to the determined channel ID, then the readout channel ID and the readout waveform probability value are stored back into the storage unit of mapping address $\tilde{A}_{in}^{k}$ in dual port RAM $J_{in}^{k}$;

if the priority of the read out channel ID is equal to that of the determined channel ID, then the readout waveform probability value is added by 1, the readout channel ID and the readout waveform probability value are stored back into the storage unit of mapping address $\tilde{A}_{in}^{k}$ in dual port RAM $J_{in}^{k}$;

if the priority of the read out channel ID is higher than that of the determined channel ID, then the readout waveform probability value is added by 1, the readout channel ID and the readout waveform probability value are stored back into the storage unit of mapping address $\tilde{A}_{in}^{k}$ in dual port RAM $J_{in}^{k}$;

4) judging whether RAM serial number $J_{in}^{k}$ is less than 4×N, if yes, then returning to step 3), otherwise, going to step 5);

5) judging whether f=L/(4×N'), if yes, then returning to step 6), otherwise, letting f=f+1 and returning to step 3);

6) judging whether c<C, if yes, then returning to step 2), otherwise, a waveform storage is completed, and outputting a waveform data output signal, where the C is a frame number for waveform mapping, which is set by the upper computer module;

a waveform data output module, when a waveform data output signal is outputted by the waveform data comparison and control module, the waveform data output control module sets waveform frame number c to 0, and then takes the control of the RAM array, sets the read mode of each dual port RAMs in the RAM array module to read_first mode, and then sends the waveform probability values outputted by RAM array module to the upper computer module, the upper computer module converts each waveform probability value into RBG values;

a display module, the upper computer module sends the RBG values of each waveform probability value to the display module, the display module displays the waveforms of input signals of four channels on a screen according the RBG values.

2. A system for data mapping and storing in digital three-dimensional oscilloscope of claim 1, further comprising a state machine for processing the parallel data of the four channels, which has 5 states of IDLE, RD_CH12, RD_CH34, WR_CH12, WR_CH34:

the state of IDLE is a initial state, when the waveform data comparison and control module receives four pairs of mapping address $\tilde{A}_{in}^{k}$ and RAM serial number $J_{in}^{k}$, i=1,2,3,4, the state machine goes into the state of RD_CH12;

the state of RD_CH12 is a state of parallel reading out channel IDs and waveform probability values of channel 1 and channel 2, under the state of RD_CH12, the waveform data comparison and control module reads out a channel ID and a waveform probability value from a storage unit of dual port RAM $J_{1n}^{k}$ according to mapping address $\tilde{A}_{in}^{k}$, and reads out a channel ID and a waveform probability value from a storage unit of dual port RAM $J_{2n}^{k}$ according to mapping address $\tilde{A}_{in}^{k}$; after one clock period, the state machine goes into the state of RD_CH34;

the state of RD_CH34 is a state of parallel reading out channel IDs and waveform probability values of channel 3 and channel 4; under the state of RD_CH34, the waveform data comparison and control module reads out a channel ID and a waveform probability value from a storage unit of dual port RAM $J_{3n}^{k}$ according to mapping address $\tilde{A}_{in}^{k}$, and reads out a channel ID and a waveform probability value from a storage unit of dual port RAM $J_{4n}^{k}$ according to mapping address $\tilde{A}_{in}^{k}$; at the same time, the waveform data comparison and control module processes the readout channel IDs and the waveform probability values of channel 1 and channel 2 according to the three conditions; after one clock period, the state machine goes into the state of WR_CH12;

the state of WR_CH12 is a state of parallel writing back the readout channel IDs and readout waveform probability values of channel 1 and channel 2, under the state of WR_CH12, the waveform data comparison and control module writes back the readout channel IDs and the readout waveform probability values of channel 1 and channel 2 to the storage units of corresponding addresses in dual port RAM; in case of the storage units for channel 1 and channel 2 are the same, only the readout channel ID and the readout waveform probability value of the channel with higher priority are stored back; at the same time, the waveform data comparison and control module processes the readout channel IDs and the waveform probability values of channel 3 and channel 4 according to the three conditions; after one clock period, the state machine goes into the state of WR_CH34;

the state of WR_CH34 is a state of parallel writing back the readout channel IDs and the readout waveform probability values of channel 3 and channel 4; under state of WR_CH34, the waveform data comparison and control module writes back the readout channel IDs and the readout waveform probability values of channel 3 and channel 4 to the storage units of corresponding addresses in dual port RAM; in case of the storage units for channel 3 and channel 4 are the same, only the readout channel ID and the readout waveform probability value of the channel with higher priority are stored back; after one clock period, judging whether c<C, if yes, the state machine goes into the state of RD_CH12, otherwise, the state machine returns to the state of IDLE.

* * * * *